United States Patent [19]
Williams

[11] Patent Number: 5,959,719
[45] Date of Patent: Sep. 28, 1999

[54] IMAGE REGISTRATION PROCESS, AN IMAGE CONTROL BOARD AND CONTROL BOARD COVER USEFUL IN THE PROCESS

[76] Inventor: Theodore Albert Williams, 17560 Kendel Ct., Hastings, Minn. 55033

[21] Appl. No.: 09/167,328

[22] Filed: Oct. 7, 1998

[51] Int. Cl.[6] .......................... G03B 27/32; G03B 27/20; B41B 11/00
[52] U.S. Cl. ................................ 355/32; 355/77; 355/91; 33/620
[58] Field of Search ................................... 355/32, 91, 73, 355/74, 75, 76, 77; 33/620, 622; 430/22, 358; 396/316

[56] References Cited

U.S. PATENT DOCUMENTS

| | | | |
|---|---|---|---|
| 4,716,443 | 12/1987 | Byers | 355/84 |
| 4,977,638 | 12/1990 | Harder | 33/621 |
| 5,075,722 | 12/1991 | Addphon et al. | 355/77 |
| 5,255,052 | 10/1993 | Ternes et al. | 355/91 |
| 5,300,973 | 4/1994 | Ternes et al. | 355/91 |
| 5,479,723 | 1/1996 | Ternes | 33/623 |
| 5,534,387 | 7/1996 | Bodager et al. | 430/325 |
| 5,592,746 | 1/1997 | Ternes | 33/623 |

*Primary Examiner*—Safet Metjahic
*Assistant Examiner*—Hung Henry Nguyen

[57] ABSTRACT

A method for aligning multiple image layers to form a composite image in which the individual single color images are aligned by systems of at least one registration hole which is round and permits no movement of the film.

7 Claims, 4 Drawing Sheets

IMAGE REGISTRATION PROCESS, AN IMAGE CONTROL BOARD AND CONTROL BOARD COVER USEFUL IN THE PROCESS

BACKGROUND OF THE INVENTION

1. Field of the Invention

This invention relates to a registration system that is useful for the formation of multicolor images. The invention also relates to an image control board and control board cover that can be used in the system.

2. Description of the Related Art

In general, multicolor images are produced by adding together multiple single-color images. The single-color images can be prepared from various photosensitive materials using color separation negatives or positives. The single-color images can be produced sequentially on the same substrate, or they can be produced individually and then laminated together. An example of this latter type of "laminate-in-register" process has been described in U.S. Pat. Nos. 5,075,722, and 5,532,115. In this type of process, in which images are laminated together, the registration is particularly critical. If the images are misaligned by even a small amount, less than 1 mm, the multicolor image can be unacceptable.

In order to register the images, it is known to match registration marks and to mount the images by means of pin holes that are aligned with the registration marks. However, in a laminate-in-register process in which the imaged materials are thermoplastic, the heat of lamination can cause the materials to elongate in the lamination direction. Thus the registration marks and registration holes will not be identically placed prior to and after lamination. This makes it particularly difficult to form well-aligned multicolor images by this process.

SUMMARY OF THE INVENTION

This invention relates to a process for the production of a multicolor image in which the individual single-color images are aligned by means of at least one registration hole which is round and permits no movement of the film, and at least one elongated hole which allows for movement only along one direction. As used herein, the term "hole" is intended to mean an opening of any shape.

In one embodiment of the process, the film is laminated such that the round registration hole is at the leading edge and the elongated hole is at the trailing edge. The process comprises the steps:

providing a first imaged film having a first leading edge, a parallel first trailing edge, the first imaged film defining at least one first imaged film round registration hole near the first leading edge and at least one first imaged film elongated hole near the first trailing edge, the at least one first imaged film elongated registration hole having a direction of elongation perpendicular to the first trailing edge;

providing at least one transfer sheet having a transfer leading edge, a parallel transfer trailing edge, the at least one transfer sheet defining at least one transfer round registration hole near the transfer leading edge and at least one transfer elongated hole near the transfer trailing edge, such that when at least one of the first imaged film round registration holes is aligned with at least one of the transfer round registration holes at least one of the first imaged film elongated registration holes can be aligned with at least one of the transfer elongated registration holes;

forming a first composite element by placing the first imaged film on the at least one transfer sheet such that at least one of the first imaged film round registration holes is aligned with at least one of the transfer round registration holes and at least one of the first imaged film elongated registration holes is aligned with at least one of the transfer elongated registration holes, the first composite element having a first composite leading edge adjacent to the first leading edge;

providing at least one second imaged film having a second leading edge, a parallel second trailing edge, the second imaged film defining at least one second imaged film round registration hole near the second leading edge and at least one second imaged film elongated hole near the second trailing edge, the at least one second imaged film elongated registration hole having a direction of elongation perpendicular to the second trailing edge;

forming a second composite element by placing the second imaged film on the first composite element such that at least one of the second imaged film round registration holes is aligned with at least one of the first imaged film round registration holes and at least one of the second imaged film elongated registration holes is at least partially aligned with at least one of the first imaged film elongated registration holes, the second composite element having a second composite leading edge adjacent to the first leading edge.

The invention also relates to an image control board to accomplish the registration of the films. The board has a multiplicity of pin positions to accommodate registrations for the alignment of multiple workpieces. The image control board comprises a planar substrate having an upper surface, a board leading edge, a parallel board trailing edge, a board side edge perpendicular to the board leading edge, and at least three registration pins projecting from the upper surface of the substrate along a pin axis perpendicular to the plane of the substrate, wherein at least one registration pin is near the board leading edge, at least one registration pin is near the board trailing edge and at least one pin is near the board side edge, and further wherein the registration pins are either removable or retractable.

A preferred image control board provides registration of various sets of workpieces, each set having a size that is different from another set. The image control board that may accommodate various sized sets includes at least three arrays of registration pin positions, wherein:

the first array is near the board leading edge, and at least one first leading edge registration pin position and at least one second leading edge registration pin position;

the second array is near the board trailing edge, the second array including at least one first trailing edge registration pin position and at least one second trailing edge registration pin position; and the third array is near the board side edge, the third array including at least one locating registration pin position and at least one edge registration pin position. Retractable or removable pins can be mounted at the registration pin positions.

The invention also relates to a control board cover useful with the image control board. The cover includes at least one leading edge opening disposed to allow at least one leading edge registration pin to pass therethrough, the at least one leading edge opening disposed at an side edge distance from the board side edge; at least one trailing edge opening disposed to allow at least one trailing edge registration pin to pass therethrough, the at least one trailing edge opening disposed at the side edge distance; at least two side edge openings disposed to allow at least one locating registration pin and at least one edge registration pin to pass therethrough; a cover medium useful for covering the remaining registration pin positions in the first, second and third arrays.

The covers used with the preferred image board accommodate photosensitive elements of different sizes.

The invention itself, together with further objects and attendant advantages, will best be understood by reference to the following drawings and detailed description.

DETAILED DESCRIPTION OF THE PREFERRED EMBODIMENTS

The present invention relates to a registration process for aligning multiple image layers to form a composite image, an image control board useful in the registration process, and a control board cover useful with the image control board.

As used herein, the terms "round" and "circular" are used interchangeably and have the same meaning.

In the process of the invention, separate single-color imaged films are prepared. These are then applied together, preferably laminated together, to form a multicolor image. Processes for forming single-color images from photosensitive materials using color separations are well known and have been described in, for example, "Imaging Processes and Materials, Neblette's Eighth Edition" edited by Sturge, Walworth and Shepp (Van Nostrand Rheinhold, 1989), and "Principles of Color Proofing" by M. Bruno (GAMA Communications, 1986). A process particularly suited for the practice of the invention has been described in U.S. Pat. No. 5,075,722, the contents of which are herein incorporated by reference.

Figure 1:
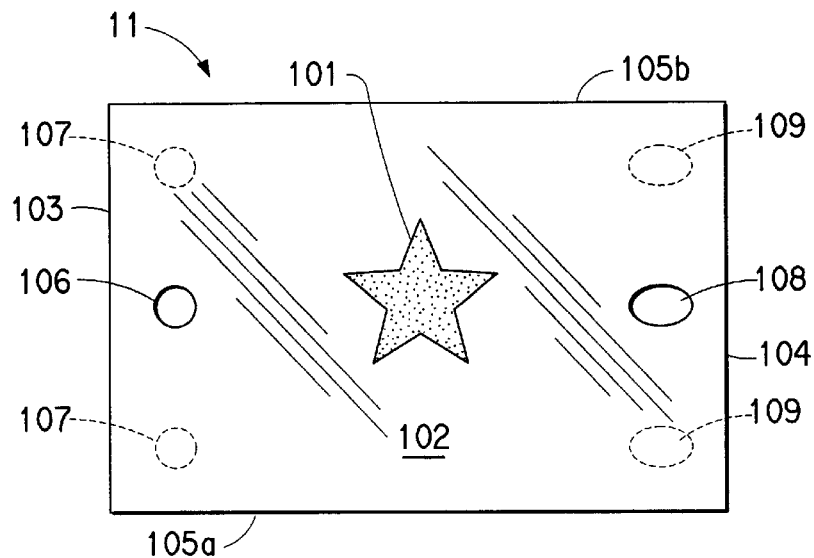
FIG. 1 is an illustration of a single-color imaged film with registration holes.

Each single-color film is given at least two registration holes. As best seen in FIG. 1, single-color imaged film 11 comprises image 101 on support 102. The support has four edges: a leading edge 103 and parallel to that a trailing edge 104; and two side edges 105a and 105b. The leading edge 103 is the edge first fed to the laminator in any lamination step. There is at least one circular registration hole 106 near the leading edge 103, preferably in the center of the leading edge 103. Optionally, there may be other circular holes 107 near the leading edge 103. The optional holes 107 may be of the same or different sizes. When registration pins (not shown) are used to align the imaged films, the size of each registration hole 106, 107 will be coordinated with the size of the registration pin on which the hole is to be mounted. If more than one circular hole is present, the holes are preferably aligned in a row that is parallel to the leading edge 103. By this it is meant that the holes 106, 107 should be aligned so that a single line (not shown) can be drawn through the midpoints of all the holes 106, 107 and the line is parallel to the leading edge.

There is at least one elongated hole 108 near the trailing edge, preferably in the center of the trailing edge 104. The elongated hole 108 has elongation perpendicular to the trailing edge 104 and parallel to the side edges 105a and 105b. As best seen in the FIG. 1, the hole 108 is an elongated circle, however, other geometries can be used in coordination with the registration pin shape. When the film 11 is placed on the registration pin, the hole 108 should allow movement of the film 11 in the direction parallel to the side edge 105, while restricting movement in any other direction. Most conveniently, a pin (not shown) having a circular cross-section can be used with a hole that is an elongated circle. Alternatively, a pin having a square cross-section can be used with a hole that is rectangular. Any other suitable combination can also be used. Optionally, there may be other elongated holes 109 near the trailing edge 104. These optional holes 109 are also elongated parallel to the side edges 105, and can have the same or different size and shape as hole 108. If more than one elongated hole is present, the holes 108, 109 should be aligned in a row that is parallel to the trailing edge 104. By this it is meant that the holes 108, 109 should be aligned so that a single line can be drawn through the midpoints of all the holes and the line is parallel to the trailing edge.

The holes can be of any size that can be conveniently aligned with other registration holes or pins without unduly interfering with the image. Generally, the round holes are in the range of about 0.06 to 0.5 inches (0.15 to 1.3 cm) in diameter; the elongated holes have a width in the range of about 0.06 to 0.5 inches (0.15 to 1.3 cm) and a length of 1.25 to 2 times the width. The holes are generally not closer than about 0.25 inches (0.6 cm) from the edge of the film in order to maintain the integrity of the hole. The holes can be made using any conventional technique, and are conveniently made using a punching apparatus.

Figure 2:
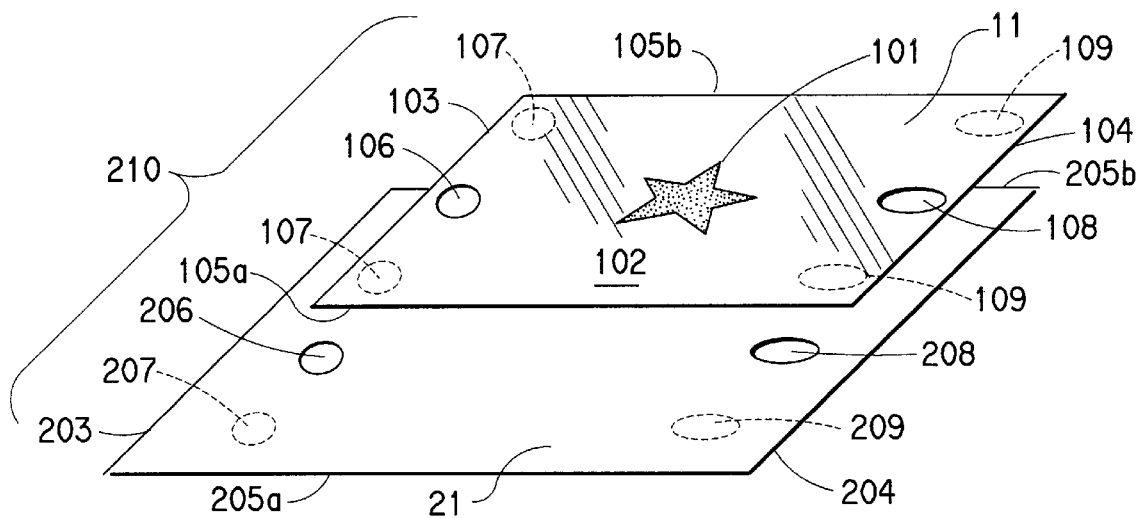
FIG. 2 is an exploded view in perspective of a single-color imaged film and transfer sheet prior to lamination.

FIG. 2 best illustrates the step of the invention in which the single-color imaged film 11 is applied to a transfer sheet 21. The transfer sheet 21 material is chosen according to the nature of the imaged film 11 such that the image 101 will adhere to the transfer sheet 21. In general, the transfer sheet 21 is a thermoplastic polymeric film that is subject to the same type of elongation as the imaged film 11 in any lamination steps. Preferred transfer sheets are polyester, which may have a subbing layer. The transfer sheet 21 has a leading edge 203, a trailing edge 204, and two side edges 205a and 205b. There is at least one circular registration hole 206 near the leading edge 203, preferably in the center of the leading edge 203. Optionally, there may be other circular holes 207 near the leading edge 203. The size, shape and position of the circular holes 206, 207 being the same as those in the imaged film 11. There is at least one elongated hole 208 near the trailing edge 204, preferably in the center of the trailing edge 204, and optional elongated holes 209. The size, shape and position of the elongated hole(s) 208, 209 are the same as those in the imaged film 11. The holes in the transfer sheet can also be made using any conventional technique, and are conveniently made using a punching apparatus.

The registration holes 106, 107, 108, 109 in the imaged film 11 are lined up over the registration holes 206, 207, 208, 209 in the transfer sheet 21 and the two are placed in contact to form a first composite element 210. It is preferred that the imaged film 11 be lined up with the transfer sheet 21 using registration pins (not shown). The pins can be mounted in any rigid substrate. Alternatively, the image control board discussed below can be used.

Figure 3:
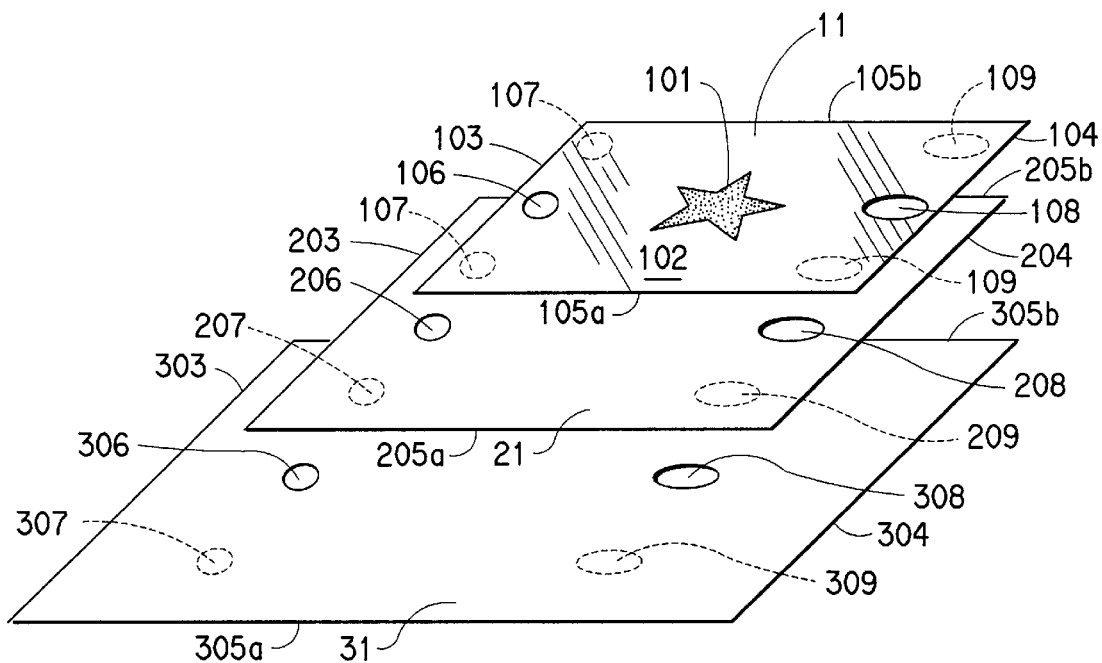
FIG. 3 is an exploded view in perspective of an imaged film, a transfer sheet and a carrier plate.

In a preferred embodiment, the imaged film is applied to the transfer sheet on a carrier plate and laminated to form a composite element. As best seen in FIG. 3, single-color imaged film 11 is applied to a transfer sheet 21 on carrier plate 31. The carrier plate 31 can be made of any material which is dimensionally stable under the laminating conditions, such as metals or high temperature resins. Typically, the carrier plate is made of aluminum. The carrier plate 31 has a leading edge 303, a trailing edge 304, and two side edges 305a and 305b. There is at least one circular registration hole 306 near the leading edge 303, preferably in the center of the leading edge 303. Optionally, there may be other circular holes 307 near the leading edge 303. There is at least one elongated hole 308 near the trailing edge 304, preferably in the center of the trailing edge 304, and optional elongated holes 309. The size, shape and position of the holes 306, 307, 308, 309 are the same as the corresponding holes 106, 107, 108, 109 in the imaged film 11. The holes in the carrier plate 31 can be made using any conventional technique. In a preferred embodiment, the transfer sheet 21 and imaged film 11 are aligned with the carrier 31 plate using registration pins (not shown) on the feed table (not shown) of a laminator. The pieces 11, 21, 31 are taped together, the pins are retracted, and then the composite piece (including carrier plate 31 with transfer sheet 21 and imaged film 21) is passed through the laminator such that the leading edge 103, 203, 303 is fed in first. Any conventional laminator for films can be used. A particularly suitable laminator has been described in U.S. Pat. No. 5,075,722. The leading edge 103, 203, 303 of the respective imaged film 11, transfer sheet 21 and carrier plate 31 is fed into the laminator first. The lamination temperature used depends on the nature and composition of the imaged film 11, transfer sheet 21 and carrier sheet 31. In general, the lamination is carried out in the temperature range of about 40 to about 80° C.

A second imaged film (not shown) is then provided, having a leading edge, parallel trailing edge and two side edges. The second imaged film has similar features of the first imaged film 11, at least one circular registration hole near the leading edge and at least one elongated registration hole near the trailing edge. The registration holes have the same size and position as the corresponding registration holes 106, 107, 108, 109 in the first imaged film. The second imaged film is applied to the image side of the first composite element 210 such that at least one round registration hole of the second imaged film is aligned with at least one round registration hole 106, 107 of the first imaged film 11. At least one elongated hole of the second imaged film is at least partially aligned with at least one elongated hole of the first imaged film. The alignment of the elongated holes may only be partial when the first composite element 210 was formed by lamination due to the slight elongation of the film 11 in the lamination process. In this case, the distance between the round hole 106, 107 and the elongated hole 108, 109 may be slightly longer in the first imaged film 11 (after lamination) than in the second imaged film, so only partial alignment of the elongated holes will be possible. The application of the second imaged film to the first composite element 210 forms a second composite element. It is preferred that the second imaged film be laminated to the first composite element 210, by feeding the leading edge into the laminator first.

The above steps can be repeated with third and fourth imaged films (not shown) to form a four-color image.

It is particularly preferred to use an image control board in the formation of the imaged films. The image control board is used to position a photosensitive element and a phototool prior to exposure and development of the photosensitive element. The photosensitive element generally comprises a support and a photosensitive layer. The photosensitive layer can be any conventionally known material which can be physically differentiated before and after exposure to actinic radiation. The photosensitive film has a leading edge, parallel trailing edge, and side edges. There is at least one round registration hole near the leading edge and at least one elongated registration hole near the trailing edge.

The phototool is a film having opaque areas and transparent areas in an image pattern, generally a photographic negative. The phototool has at least one round registration hole near one phototool side edge, preferably near the middle of one side edge. Most preferably, the phototool has a round registration hole near the middle of one side edge and a plurality of elongated holes disposed on either side of the round registration hole along the side edge, wherein the elongation is parallel to the side edge.

The image control board comprises a planar substrate having a plurality of pin positions for receiving and/or securing pins that project from the upper surface of the substrate along a pin axis perpendicular to the plane of the substrate. The image control board has a leading edge, a parallel trailing edge and two side edges perpendicular to the leading edge. There is at least one first registration pin position near the leading edge and at least one second registration pin position near the trailing edge, and at least one third registration pin position near one side edge. The pin positions are positioned such that when at least one of the round holes of the photosensitive element is aligned with the first registration pin position and at least one of the elongated holes of the photosensitive element can be aligned with the second registration pin position. The image control board can be of any dimensionally stable material which is durable to handling and storage and which is thermally stable at room temperature from about 60 to about 85° F. (15 to 30° C.). Suitable materials include metals, such as aluminum, and rigid plastics, which may be reinforced with metal strips where the pin positions are located.

The pin positions are depressions, openings or slots on the surface of the image control board. These depressions have sufficient depth and dimensions to receive and/or secure the end of registration pins so that each pin projects from the upper surface of the substrate along a pin axis perpendicular to the plane of the substrate.

The pins are generally made of a metal such as steel or aluminum, but can also be made of polymeric and reinforced polymeric materials. The pins are preferably either retractable or removable. The removable pins can be drop-in pins which simply fit into slots in the substrate, or they can be screwed in. The pins are generally of round cross-section and have a diameter in the range of about 0.06 to 0.5 inches (0.15 to 1.3 cm). In order to affix the registration holes in the photosensitive film and phototool to the pins, the pins should project at least about 0.04 inches (0.1 cm) above the plane of the substrate. If the pins are retractable, they will project above the surface a distance no greater than the thickness of the substrate.

Figure 4:
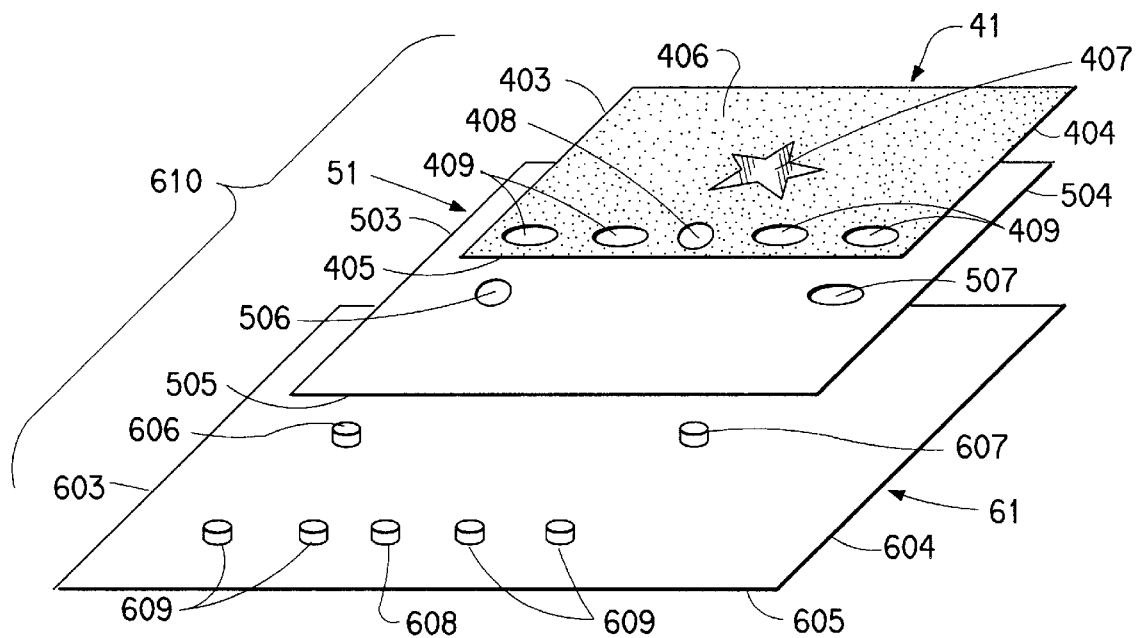
FIG. 4 is an exploded view in perspective of a phototool, photosensitive film, and image control board.

FIG. 4 best illustrates how a phototool 41 and a photosensitive element 51 are mounted on the image control board 61. Phototool 41 has leading edge 403, trailing edge 404 and side edge 405. The phototool 41 has opaque areas 406 and transparent areas 407 corresponding to the desired image. Round registration hole 408 is located near the center of side edge 405. As illustrated here, there are four other elongated registration holes 409 located on either side of round hole 408 in a line parallel to the side edge. The direction of elongation is parallel to the side edge.

Photosensitive element 51 has leading edge 503, trailing edge 504 and side edge 505. A round registration hole 506 is located near the center of the leading edge 503. An elongated registration hole 507 is located near the center of the trailing edge.

Image control board 61 has a leading edge 603, a trailing edge 604 and side edge 605. A first registration pin 606 is located near the leading edge 603. A second registration pin 607 is located near the trailing edge 604. Pins 606 and 607 are secured in pin positions (not shown) and positioned such that when registration hole 506 in the photosensitive element 51 is mounted over pin 606, registration hole 507 can be mounted over pin 607. Five registration pins 608 and 609 are placed in a row that forms a parallel line near the side edge 605. Registration pins 608, 609 are positioned such that when round hole 408 in the phototool 41 is mounted over the center locating pin 608, the elongated holes 409 can be mounted over the remaining pins 609. Registration pins 606, 607, 608 and 609 are preferably retractable, but can also be removable. The retractable pins are spring loaded such that they are pushed flush with or below the surface when a mild pressure is placed vertically on them, such as the pressure exerted by a vacuum frame. Although not shown, retractable pins are generally wider at the base as compared to the head. Removable pins can be screw-on pins or drop-in pins.

After the photosensitive element 51 and the phototool 41 are mounted onto the image control board 61, the assembly 610 is placed in a unit (not shown) for exposure to actinic radiation, generally a vacuum frame exposure unit. The photosensitive element 51 is exposed through the phototool 41 for a time sufficient to make the exposed and nonexposed areas physically differentiable. The assembly 610 is removed from the exposure unit and the phototool 41 and exposed photosensitive element 51 are removed from the image control board 61. The exposed photosensitive element 51 is then developed according to the nature of the photosensitive material, as is well known in the art, to form an imaged film. Typically, the exposure step is carried out with UV, visible or infrared radiation; the development step is carried our by washoff or toning of the exposed or nonexposed areas.

Figure 5:
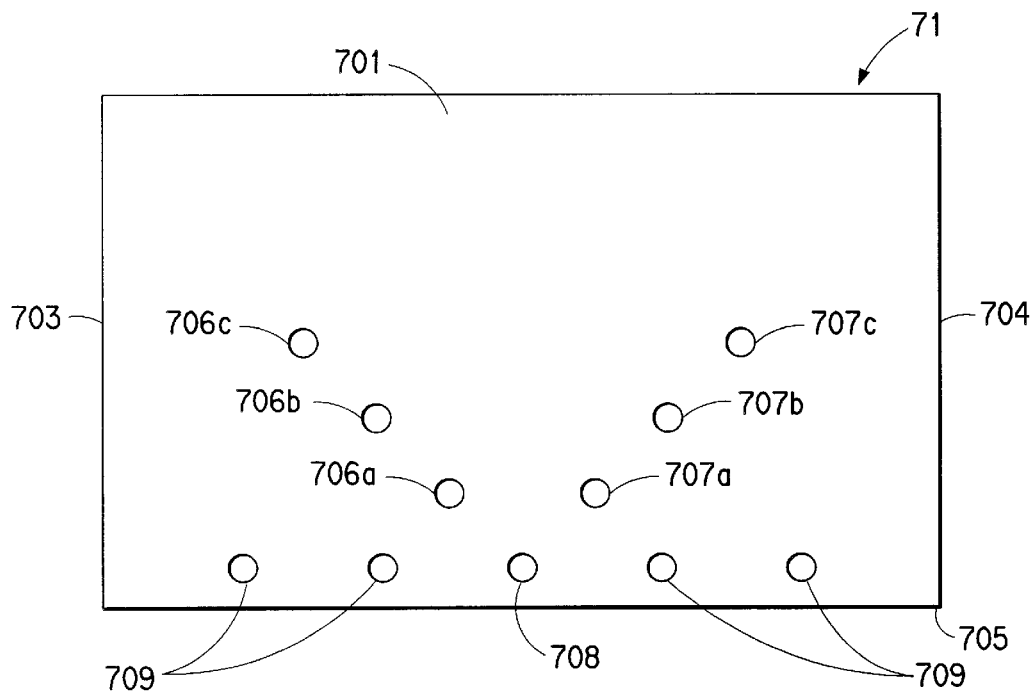
FIG. 5 is top view of the image control board of the invention.

In the proofing industry, photosensitive elements of various different sizes are used. A particularly preferred image control board which can accommodate photosensitive elements of different sizes is best illustrated in FIG. 5. Board 71 has an upper surface 701, leading edge 703, trailing edge 704 and relevant side edge 705. A first array of registration pin positions 706a–c and a second array of registration pin positions 707a–c are mounted in the board. When registration pins (not shown) are mounted to the board 71, the pin axis (not shown) of the registration pins is perpendicular to the plane of the board (plane intersecting the board). The first array of leading edge pin positions 706a–c correspond to the leading edge round registration holes of photosensitive elements (not shown) of three different sizes. The second array of trailing edge pin positions 707a–c correspond to the trailing edge elongated registration holes of photosensitive elements (not shown) of three different sizes. The leading edge registration pin position 706a and trailing end registration pin position 707a are disposed at the same distance from the side edge 705, and can be used to align a smallest photosensitive element; registration pin positions 706b and 707b are disposed at the same distance from the side edge 705, and can be used to align an intermediate sized photosensitive element; finally, and pin positions 706c and 707c, which are the same distance from the side edge 705 can be used to align a largest photosensitive element.

Locating registration pin position 708 and edge pin position 709 correspond with the side edge phototool registration holes 408, 409. As best seen in FIG. 5, a line (not shown) intersecting the center of the registration pin positions 708, 709 in the third array is preferably parallel to the side edge 705. As best seen in FIG. 5, locating pin position 708 is preferably equidistance from the trailing edge 703 and trailing edge 704. As best seen in FIG. 5, the first array of pin positions 706a–c, the second array of pin positions 707a–c and the locating pin position 708 form a letter "V" shape.

The registration pins (not shown) mounted on board 71 at the registration pin positions 706a–c, 707a–c, 708, 709 preferably have a circular cross-section and can be the same or different in size relative to each other, coordinated with the size of the corresponding hole(s) in the photosensitive elements and phototools. It is preferred that all the pin mounted in positions 706a–c and 707a–c have the same size.

Figure 6A:
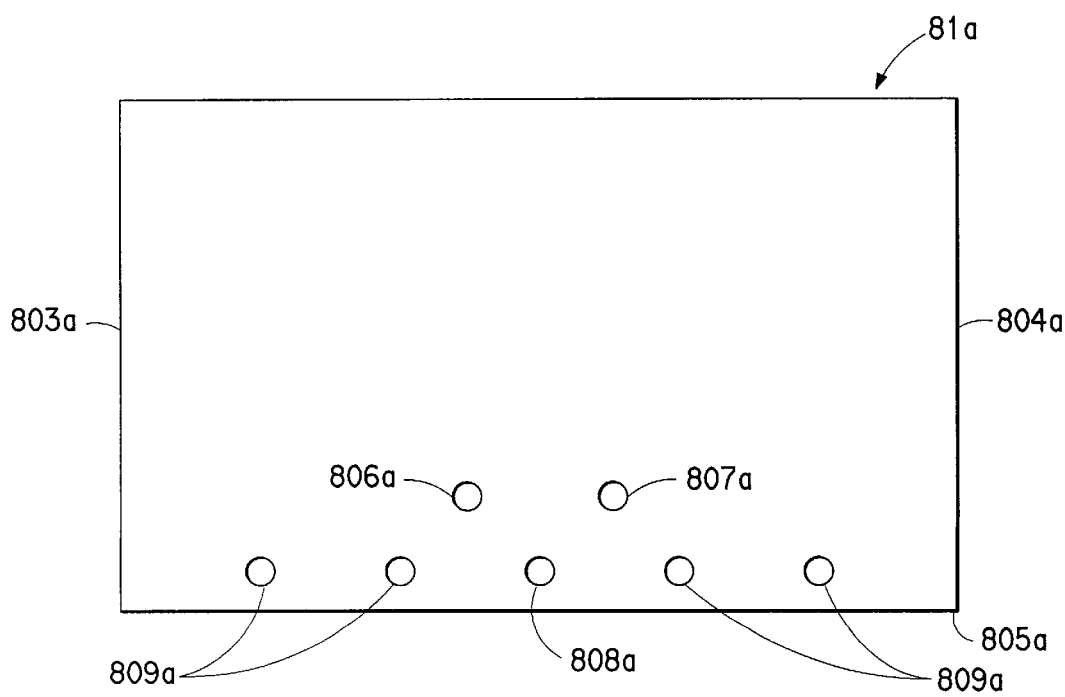
FIG. 6A is a top view of a image control board cover useful with the board of FIG. 5 to accommodate a small photosensitive element.
Figure 6B:
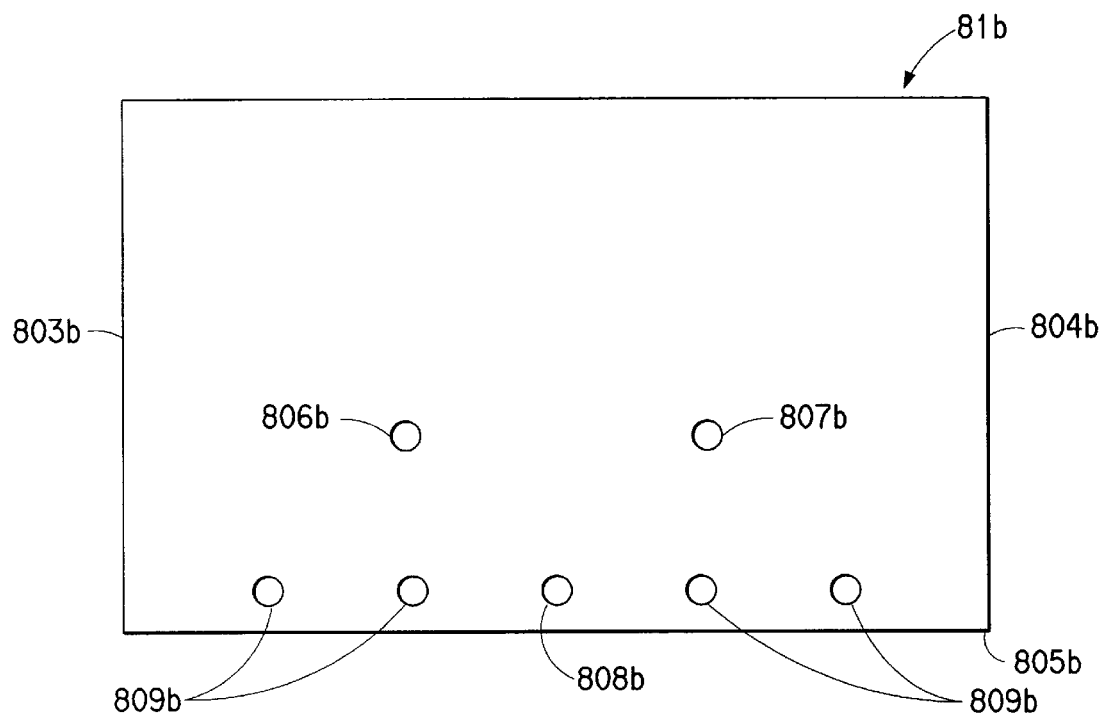
FIG. 6B is a top view of a image control board cover useful with the board of FIG. 5 to accommodate a photosensitive element that is larger than the photosensitive element accommodated by the cover in FIG. 6A.
Figure 6C:
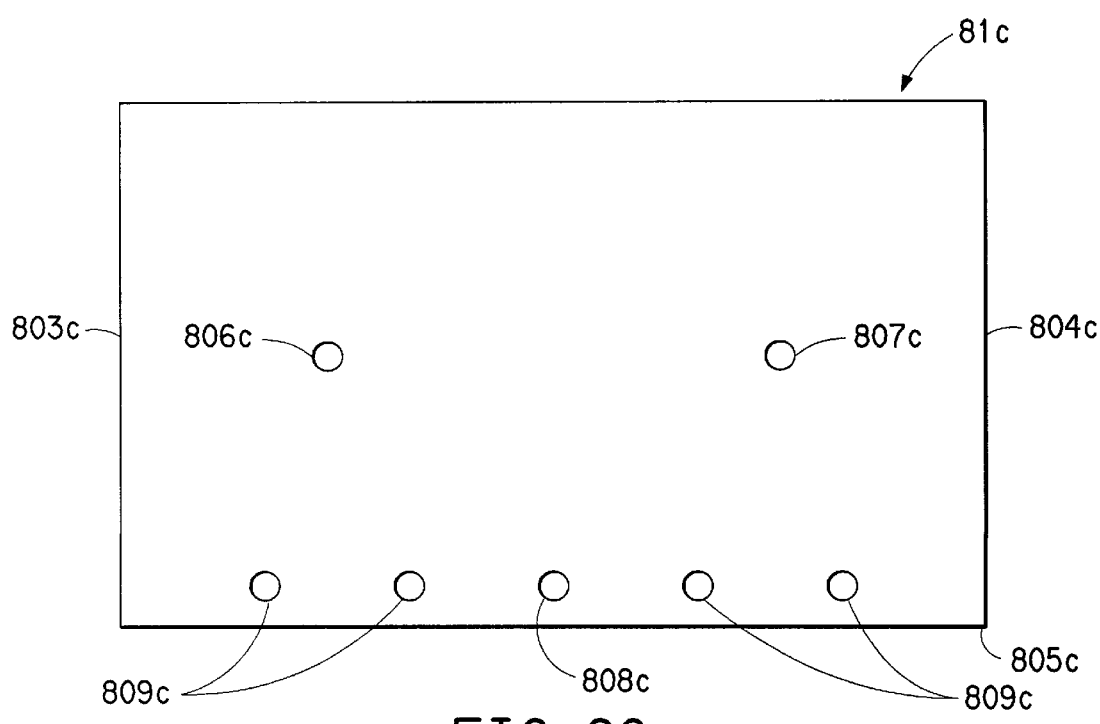
FIG. 6C is a top view of a image control board cover useful with the board of FIG. 5 to accommodate a photosensitive element that is larger than the photosensitive element accommodated by the cover in FIG. 6A.

The pins which are not used for a particular photosensitive element can either be removed or retracted. It is also possible to provide a series of image control board covers which have openings for only one size of photosensitive element. Such covers are best illustrated in FIGS. 6a–c. The covers 81a, 81b, and 81c have leading edges 803a–c, trailing edges 804a–c and side edges 805a–c. Openings 806a–c correspond to the leading edge round registration holes of the photosensitive elements. Openings 807a–c correspond to the trailing edge elongated registration holes of the photosensitive elements. Openings 808a–c correspond to the side edge holes in the phototool. The openings 807a–c, 808a–c are generally larger than the corresponding registration pin they will leave uncovered to allow for ease of use. FIG. 6a represents an image control board cover 81a for a smaller photosensitive film. It will leave uncovered, pins at registration pin positions 706a and 707a in image control board 71 in FIG. 5. FIG. 6b shows an image control board 81b cover for an intermediate-sized photosensitive film. It will leave uncovered, pins mounted at registration pin positions 706b and 707b in image control board 71 in FIG. 5. FIG. 6c represents an image control board cover 81c for a large photosensitive film. It will leave uncovered, pins mounted at registration pin positions 706c and 707c in image control board 71 in FIG. 5.

When retractable pins are used, the image control board cover should have sufficient weight to push down the pins mounted at registration pin positions that are covered by the image control board cover to maintain the pins in the retracted positions. When removable pins are use, all pins should be first removed, the cover should then be placed on the board, and then the pins should be placed in the registration pin positions that are left uncovered. In both cases, the cover should not be so thick as to prevent the pins from protruding a sufficient amount to allow the photosensitive element and phototool to be mounted. Almost any material can be used. Preferred cover materials include, for example, polymeric or rubber materials. Vinyl is a more preferred material.

The image control board of the invention that has been illustrated here can be used with three different sizes of films. However, it will be understood that the number of pins on the board can be varied so that the board is useful for any number of films from two and greater. The exact placement of the pins or pin openings will depend on the exact size of the films to be used in the process and the size of the laminating equipment.

Of course, it should be understood that a wide range of changes and modifications can be made to the preferred embodiment described above. It therefore is intended that the foregoing detailed description be regarded as illustrative rather than limiting and that it be understood that it is the following Claims, including all equivalents, which are intended to define the scope of this invention.

What is claimed is:

1. A method for registering at least two imaged films, the method comprising:

providing a first imaged film having a first leading edge, a parallel first trailing edge, the first imaged film defining at least one first imaged film round registration hole near the first leading edge and at least one first imaged film elongated hole near the first trailing edge, the at least one first imaged film elongated registration hole having a direction of elongation perpendicular to the first trailing edge;

providing at least one transfer sheet having a transfer leading edge, a parallel transfer trailing edge, the at least one transfer sheet defining at least one transfer round registration hole near the transfer leading edge and at least one transfer elongated hole near the transfer trailing edge, such that when at least one of the first imaged film round registration holes is aligned with at least one of the transfer round registration holes at least one of the first imaged film elongated registration holes can be aligned with at least one of the transfer elongated registration holes;

forming a first composite element by placing the first imaged film on the at least one transfer sheet such that at least one of the first imaged film round registration holes is aligned with at least one of the transfer round registration holes and at least one of the first imaged film elongated registration holes is aligned with at least one of the transfer elongated registration holes, the first composite element having a first composite leading edge adjacent to the first leading edge;

providing at least one second imaged film having a second leading edge, a parallel second trailing edge, the second imaged film defining at least one second imaged film round registration hole near the second leading edge and at least one second imaged film elongated hole near the second trailing edge, the at least one second imaged film elongated registration hole having a direction of elongation perpendicular to the second trailing edge;

forming a second composite element by placing the second imaged film on the first composite element such that at least one of the second imaged film round registration holes is aligned with at least one of the first imaged film round registration holes and at least one of the second imaged film elongated registration holes is at least partially aligned with at least one of the first imaged film elongated registration holes, the second composite element having a second composite leading edge adjacent to the first leading edge.

2. The method of claim 1, further comprising:

providing a carrier plate having a carrier leading edge, a parallel carrier trailing edge, the at least one carrier plate defining at least one carrier round registration hole near the carrier leading edge and at least one carrier elongated hole near the carrier trailing edge, such that when at least one of the first imaged film round registration holes is aligned with at least one of the carrier round registration holes at least one of the first imaged film elongated registration holes can be aligned with at least one of the carrier elongated registration holes;

placing the transfer sheet on the carrier plate prior to form the first composite element, such that at least one of the transfer round registration holes is aligned with at least one of the carrier round registration holes and at least one of the transfer elongated registration holes is aligned with at least one of the carrier elongated registration holes;

placing the first composite element on the carrier plate prior to forming the second composite element, such that at least one of the first imaged film round registration holes is aligned with at least one of the carrier round registration holes and at least one of the first imaged film elongated registration holes is at least partially aligned with at least one of the carrier elongated registration holes.

3. The method of claim 2 wherein:

the first composite element is formed by feeding the first composite leading edge on the carrier plate into a laminator;

the second composite element is formed by feeding the second composite leading edge on the carrier plate into the laminator.

4. The method of claim 1, further comprising:

providing a substrate including at least one first pin attached to the substrate and at least one second pin attached to the substrate, wherein the first pin has a round cross-section approximately the same diameter as the first imaged film round registration hole, and the second pin has a cross-section which allows the first imaged film elongated registration hole to be mounted over the second pin;

placing the transfer sheet on the substrate and placing the first imaged film over the transfer sheet, such that the first imaged film elongated registration hole is mounted over the second pin, thereby allowing the first imaged film to move in the direction perpendicular to the first trailing edge but preventing movement of the first imaged film in the direction parallel to the first trailing edge.

5. The method of claim 4 further comprising the step of placing the second imaged film on first composite element, such that when the second imaged film elongated registration hole is mounted over the second pin, thereby allowing the second imaged film can to move in the direction perpendicular to the second trailing edge, but preventing movement of the second imaged film in the direction parallel to the second trailing edge.

6. The method of claim 1, further comprising:

providing at least one third imaged film having a third leading edge, a parallel third trailing edge, the third imaged film defining at least one third imaged film round registration hole near the third leading edge and at least one third imaged film elongated hole near the third trailing edge, the at least one third imaged film elongated registration hole having a direction of elongation perpendicular to the third trailing edge;

forming a third composite element by placing the third imaged film on the second composite element such that at least one of the third imaged film round registration holes is aligned with at least one of the second imaged film round registration holes and at least one of the third imaged film elongated registration holes is at least partially aligned with at least one of the second imaged film elongated registration holes, the third composite element having a third composite leading edge adjacent to the first leading edge;

providing at least one fourth imaged film having a fourth leading edge, a parallel fourth trailing edge, the fourth imaged film defining at least one fourth imaged film round registration hole near the fourth leading edge and at least one fourth imaged film elongated hole near the fourth trailing edge, the at least one fourth imaged film elongated registration hole having a direction of elongation perpendicular to the fourth trailing edge;

forming a fourth composite element by applying the fourth imaged film to the third composite element such that at least one of the fourth imaged film round registration holes is aligned with at least one of the third imaged film round registration holes and at least one of the fourth imaged film elongated registration holes is at least partially aligned with at least one of the third imaged film elongated registration holes, the fourth composite element having a fourth composite leading edge adjacent to the first leading edge.

7. The method of claim 1 wherein the first imaged element is formed by:

providing a first photosensitive element having a first leading edge, a parallel first trailing edge, the first photosensitive element defining at least one first photosensitive element round registration hole near the first leading edge and at least one first photosensitive element elongated hole near the first trailing edge, the at least one first photosensitive element elongated registration hole having a direction of elongation perpendicular to the first trailing edge;

providing at least one first phototool having a first phototool leading edge, a parallel first phototool trailing edge, a first phototool side edge perpendicular to the first phototool leading edge, the first phototool defining at least one phototool round registration hole near the first phototool side edge;

providing an image control board comprising a substrate having an upper surface, a leading board edge, a parallel trailing board edge, a side board edge perpendicular to the leading board edge, and at least one first element registration pin, at least one second element registration pin and at least one first phototool registration pin, said registration pins projecting from the upper surface of the substrate along a pin axis perpendicular to the plane of the substrate, such that when at least one of the first photosensitive element round registration holes is aligned with the first element registration pin at least one of the first photosensitive element elongated registration holes can be aligned with the second element registration pin, and said at least one phototool registration pin is near the board side edge;

placing the first photosensitive element on the upper surface of the image control board such that at least one of the first photosensitive element round registration holes is aligned with the first element registration pin and at least one of the first photosensitive element elongated registration holes is aligned with the second element registration pin;

placing the phototool over the first photosensitive film such that at least one phototool round registration hole is aligned with at least one phototool registration pin;

exposing the photosensitive element to actinic radiation through the phototool;

removing the first phototool and the first exposed element from the image control board;

developing the first exposed element to form a first imaged film.

* * * * *